United States Patent
Kang

(10) Patent No.: US 7,915,821 B2
(45) Date of Patent: Mar. 29, 2011

(54) OLED COMPRISING AN ORGANIC INSULATING LAYER WITH GROOVES AND AN INORGANIC LAYER FILLING THE GROOVES

(75) Inventor: Tae-Wook Kang, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 529 days.

(21) Appl. No.: 11/247,398

(22) Filed: Oct. 11, 2005

(65) Prior Publication Data

US 2006/0076887 A1    Apr. 13, 2006

(30) Foreign Application Priority Data

Oct. 11, 2004    (KR) .................. 10-2004-0081102

(51) Int. Cl.
*H01L 51/50* (2006.01)
(52) U.S. Cl. ........................................ 313/512; 313/506
(58) Field of Classification Search .................. None
See application file for complete search history.

(56) References Cited

U.S. PATENT DOCUMENTS

| | | | |
|---|---|---|---|
| 6,194,249 B1 | 2/2001 | Chen et al. | |
| 6,531,815 B1 | 3/2003 | Okuyama et al. | |
| 6,861,710 B2 * | 3/2005 | Murakami et al. | 257/359 |
| 2003/0127651 A1 | 7/2003 | Murakami et al. | |
| 2003/0129790 A1 | 7/2003 | Yamazaki et al. | |
| 2003/0183830 A1 | 10/2003 | Yamazaki et al. | |
| 2004/0124546 A1 | 7/2004 | Saran et al. | |
| 2004/0192024 A1 * | 9/2004 | Ito | 438/623 |
| 2005/0224820 A1 | 10/2005 | Yamazaki et al. | |

FOREIGN PATENT DOCUMENTS

| | | |
|---|---|---|
| CN | 1419297 | 5/2003 |
| JP | 2003-229250 | 8/2003 |
| JP | 2003-317971 | 11/2003 |
| JP | 2003-332073 | 11/2003 |
| KR | 2003-0089447 | 11/2003 |
| WO | WO 2004/060021 A1 | 12/2003 |

OTHER PUBLICATIONS

English Translation of First Office Action dated Jul. 11, 2008.
International Search Report dated Feb. 3, 2004.

* cited by examiner

*Primary Examiner* — Toan Ton
*Assistant Examiner* — Britt D Hanley
(74) *Attorney, Agent, or Firm* — Knobbe Martens Olson & Bear, LLP.

(57) ABSTRACT

Embodiments of an organic electroluminescence display device and methods of fabricating such devices are disclosed. One embodiment of an organic electroluminescence display device comprises a thin film transistor and wirings disposed on a substrate, wherein the substrate has an emitting region and non-emitting region. The display device further comprises a first insulating layer disposed on the substrate in the emitting region and the non-emitting region, a pixel electrode disposed on the first insulating layer, a second insulating layer disposed on the emitting region to partially expose the pixel electrode, a light-emitting layer disposed on the pixel electrode, and an encapsulation member disposed on the second insulating layer on the non-emitting region.

9 Claims, 4 Drawing Sheets

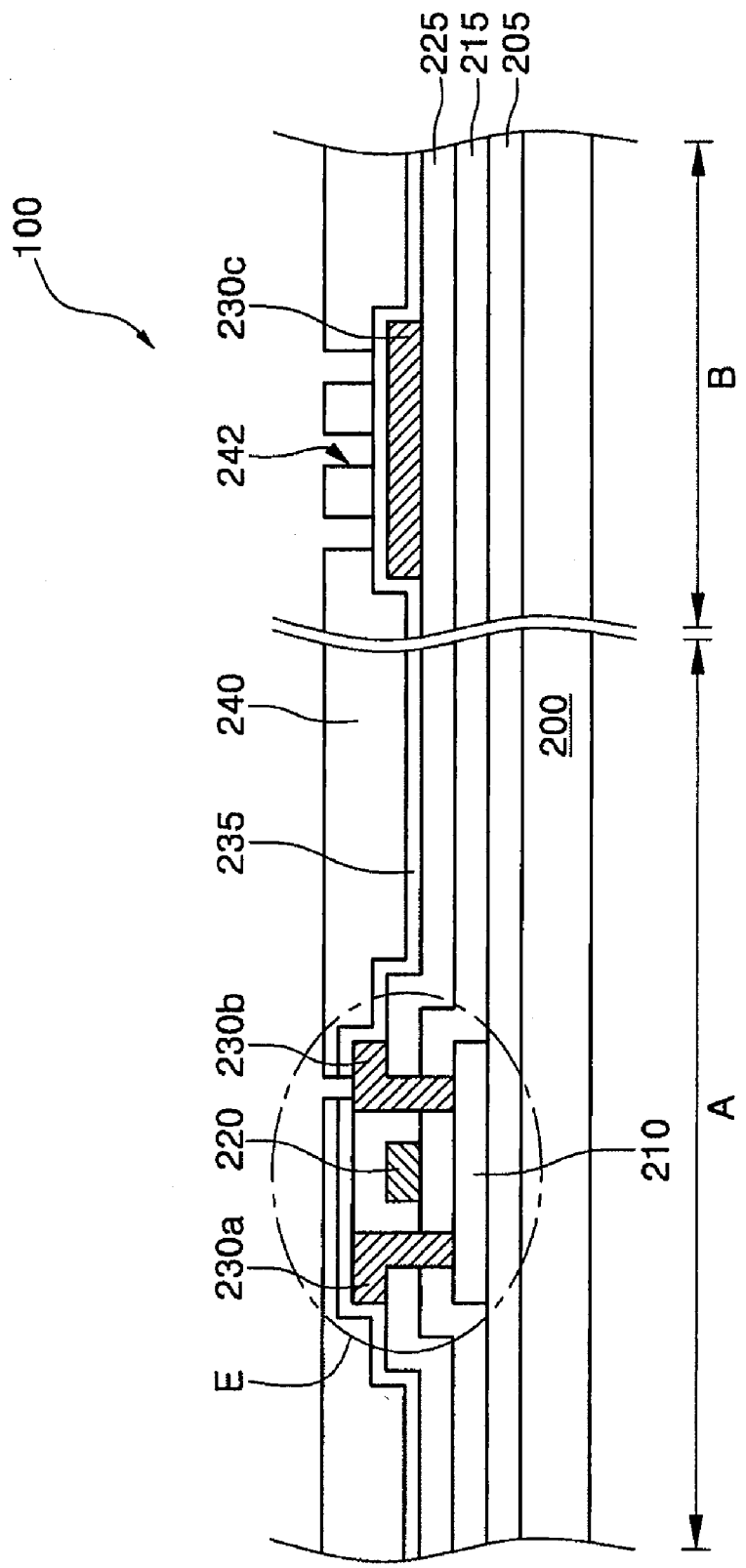

OLED COMPRISING AN ORGANIC INSULATING LAYER WITH GROOVES AND AN INORGANIC LAYER FILLING THE GROOVES

CROSS-REFERENCE TO RELATED PATENT APPLICATION

This application claims the benefit of Korean Patent Application No. 10-2004-0081102, filed on Oct. 11, 2004, in the Korean Intellectual Property Office, the disclosure of which is incorporated herein in its entirety by reference

BACKGROUND OF THE INVENTION

1. Field of the Invention

The present invention relates to an organic electroluminescence display device and a method of fabricating the same, and more particularly, to an organic electroluminescence display device comprising a groove formed in an insulating layer under an encapsulation member to increase an adhesive force between the insulating layer and a sealant.

2. Description of the Related Technology

A flat panel display comprising an organic electroluminescence display device has a fast response speed of less than 1 ms and low power consumption. In addition, viewing angle problems are minimized because the organic electroluminescence display device is a self-emitting device. Furthermore, the organic electroluminescence display device can effectively display high quality video. With respect to manufacturing advantages, organic electroluminescence display devices can be manufactured at a low temperature, and the production process is simplified by using existing semiconductor production techniques. Therefore, the organic electroluminescence display device is advantageous as a flat panel display device.

An exemplary organic electroluminescence display device comprises an organic light-emitting device, such as an organic light emitting diode (OLED), formed on an insulating substrate, and an encapsulation substrate formed on an upper portion of the organic light-emitting device to face the insulating substrate.

Deterioration of the display device components may occur where a light-emitting layer material of the organic light-emitting device and a cathode electrode material have low moisture resistance and acid resistance. This operational deterioration may generate non-emitting regions, which may be referred to as dark spots. Over time, the dark spots diffuse over the entire device, and the device has a discernable reduction in light emission.

To prevent such deterioration of the display, an encapsulation process is performed to prevent the device from being exposed to moisture and oxygen. In the encapsulation process, a moisture absorbing agent is formed in the encapsulation substrate. After the moisture absorbing agent is fixed within the encapsulation substrate, the lower and upper insulating substrates are attached to each other by means of the encapsulation member in an inert gas ambient of nitrogen gas ($N_2$) or argon (Ar).

However, in a top-emitting organic electroluminescence display device, an organic planarization layer or a pixel defining layer constructed with an organic layer is an essential component of the device. The attachment force between the encapsulation member and the lower substrate thereby decreases, resulting in defects due to deterioration or dark spots caused by exposure to ambient moisture and oxygen.

SUMMARY OF CERTAIN INVENTIVE EMBODIMENTS

Embodiments of the invention may increase an adhesive force of an encapsulation member of an organic electroluminescence display device by forming a pixel defining layer with an inorganic layer, and forming the inorganic layer up to a non-emitting region to form the inorganic layer between a planarization layer and the encapsulation member.

Embodiments of the invention may also increase contact area to an upper inorganic pixel defining layer and improve encapsulation capability by forming grooves on a planarization layer One embodiment of an organic electroluminescence display device comprises a thin film transistor and wirings disposed on a substrate, wherein the substrate has an emitting region and non-emitting region, and a first insulating layer disposed on the emitting region and the non-emitting region of the substrate. The display device further comprises a pixel electrode disposed on the first insulating layer, a second insulating layer disposed on the emitting region to partially expose the pixel electrode, a light-emitting layer disposed on the pixel electrode, and an encapsulation member disposed on the second insulating layer on the non-emitting region.

In some embodiments, the first insulating layer on the non-emitting region comprises at least one groove, and the groove may be filled with the second insulating layer.

One embodiment of a method of fabricating an organic electroluminescence display device comprises forming a thin film transistor and wirings on a substrate having an emitting region and non-emitting region, and forming an insulating layer on the substrate to form a first insulating layer on the emitting region and the non-emitting region of the substrate. The method further comprises forming a via in the first insulating layer on the emitting region, forming a pixel electrode connected to a lower thin film transistor through the via, and forming an inorganic insulating layer on the substrate. The method also comprises performing a patterning process to expose the pixel electrode and forming a second insulating layer to be stacked on the non-emitting region, forming a light-emitting layer on the exposed pixel electrode on the light-emitting region, and encapsulating the substrate.

In some embodiments, the via is formed on the first insulating layer of the emitting region of the substrate, and at the same time, at least one groove may be formed on the first insulating layer of the non-emitting region.

BRIEF DESCRIPTION OF THE DRAWINGS

FIGS. 2A-2C are cross sectional views of unit pixels and encapsulation members taken along line I-I' of FIG. 1, illustrating one embodiment of a method of fabricating the organic electroluminescence display device of FIG. 1.

DETAILED DESCRIPTION OF CERTAIN INVENTIVE EMBODIMENTS

Figure 1:
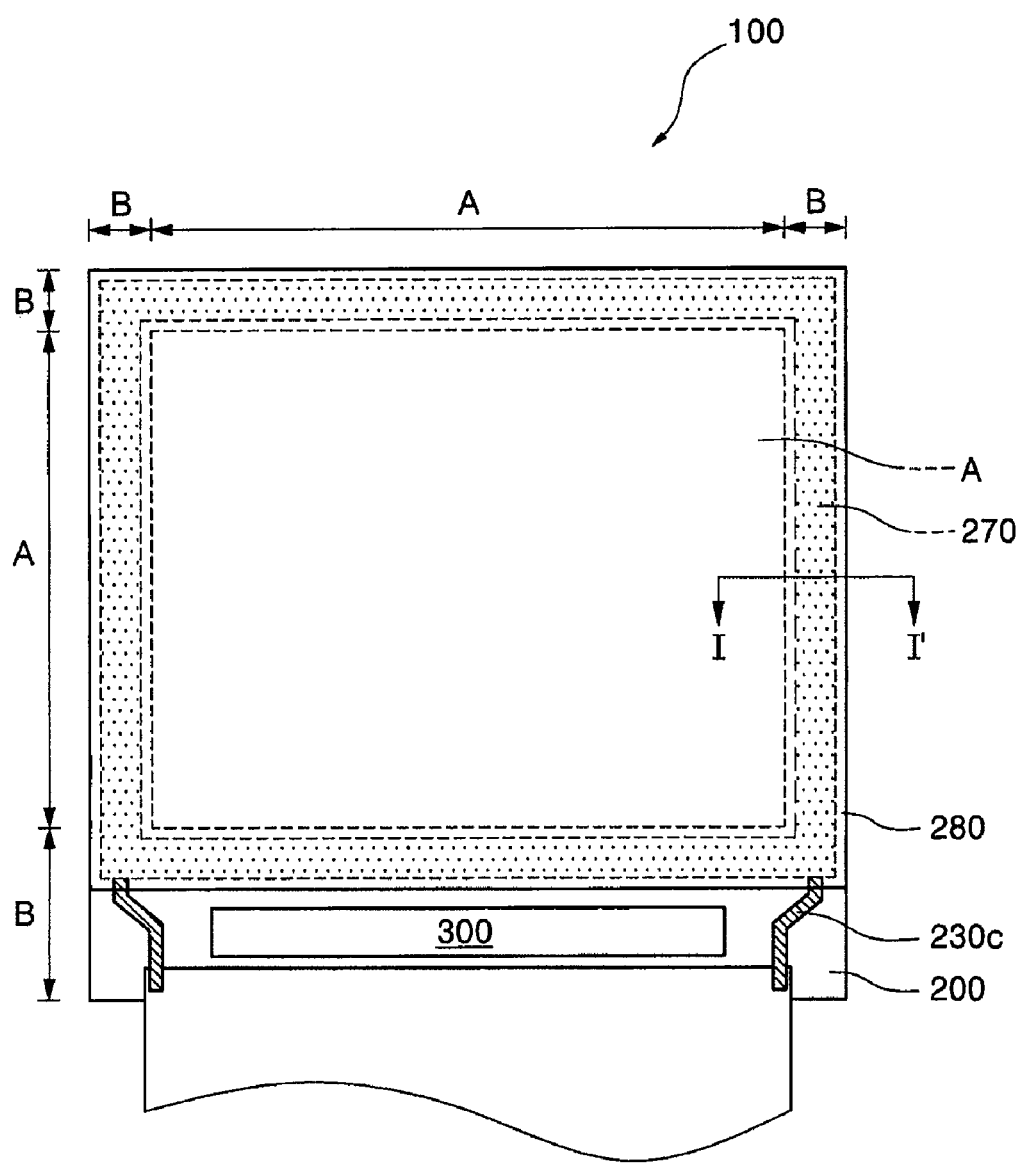
FIG. 1 is a plan view of one embodiment of an organic electroluminescence display device.

The present invention will now be described more fully with reference to the accompanying drawings, in which exemplary embodiments of the invention are shown. The invention may, however, be embodied in many different forms and should not be construed as being limited to the embodiments set forth herein. In the drawings, the thicknesses and lengths of layers and regions are exaggerated for clarity. In this description, reference is made to the drawings wherein like parts are designated with like numerals throughout.

FIG. 1 is a plan view of one embodiment of an organic electroluminescence display device 100. Referring to FIG. 1, a substrate 200 has an emitting region A and a non-emitting region B, wherein a plurality of organic electroluminescence devices are disposed in the emitting region A. The plurality of organic electroluminescence devices are driven in accordance with drive signals from drivers 300, such as scan drivers and data drivers, which are located outside the emitting region A.

The display device 100 further comprises one or more encapsulation members 270 disposed in the non-emitting regions B. An encapsulation substrate 280 is disposed on the organic electroluminescence devices and the encapsulation member 270, such that the plurality of the organic electroluminescence devices is encapsulated by the encapsulation member 270 and the encapsulation substrate 280.

The display device also comprises power supply lines 230c disposed on one or more side surfaces of the emitting region A of the substrate 200, wherein the power supply lines 230c are configured to supply a driving power to the organic electroluminescence devices. The power supply lines 230c of the non-emitting region are disposed under the encapsulation member 270.

Figure 2B:
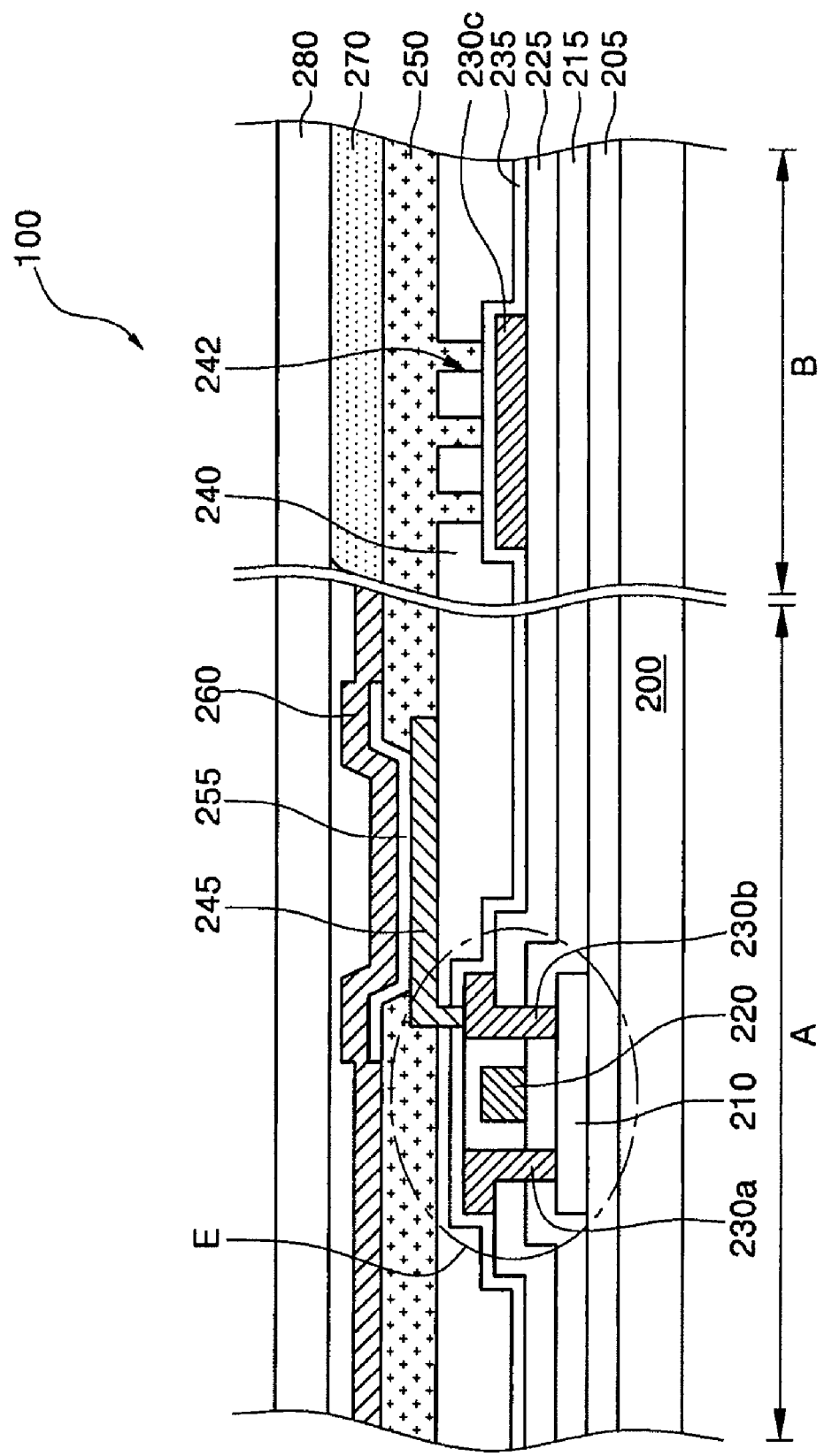

FIG. 2A is a cross-sectional view of a portion of the display including a unit pixel and FIG. 2B is a cross-sectional view of a portion of the display including encapsulation members taken along line I-I' of FIG. 1. As illustrated, thin film transistors E, capacitors (not shown), and wirings 230c are disposed on the substrate 200. A first insulating layer 240 is disposed on the emitting region A and the non-emitting region B of the substrate 200.

In one embodiment, the first insulating layer 240 is an organic layer. The first insulating layer 240 may comprise one or more of a polyacrylates resin, an epoxy resin, a phenolic resin, a polyamides resin, a polyimides resin, an unsaturated polyesters resin, a poly phenylenethers resin, a poly phenylenesulfides resin, and benzocyclobutene (BCB).

Referring to FIG. 2B, pixel electrodes 245 are disposed on the first insulating layer 240 in the emitting region A. In addition, a second insulating layer 250, comprising an inorganic layer disposed on the non-emitting region B, is provided with an opening to partially expose the pixel electrode 245 in the emitting region A. The second insulating layer 250 may comprise at least one of a single silicon oxide layer, a single silicon nitride layer, and a stacked layer of a silicon oxide layer and a silicon nitride layer.

The display device 100 further comprises a light-emitting layer 255 disposed on the exposed pixel electrode 245, and the encapsulation member 270 is disposed on the second insulating layer 250 in the non-emitting region B. Thereby, a structure is formed in the non-emitting region B, wherein the second insulating layer 250, made of an inorganic material, is interposed between the first insulating layer 240, made of an organic material, and the encapsulation member 270. This structure improves the adhesive force between the first insulating layer 240 and the encapsulation member 270.

In the emitting region A, the second insulating layer 250, comprising an inorganic material and having a uniform thickness, is employed as a pixel defining layer, thereby implementing a pixel defining layer that is thin. As a result, this thin pixel defining layer can be more readily patterned via a laser induced thermal imaging method.

Referring to FIG. 2A, the first insulating layer 240 in the non-emitting region B comprises at least one groove 242. In some embodiments, the grooves 242 are filled with the second insulating layer 250, as shown in FIG. 2B. One or more of the grooves 242 may be a circular or polygonal hole, a slit, or a trench, for example.

Figure 2C:
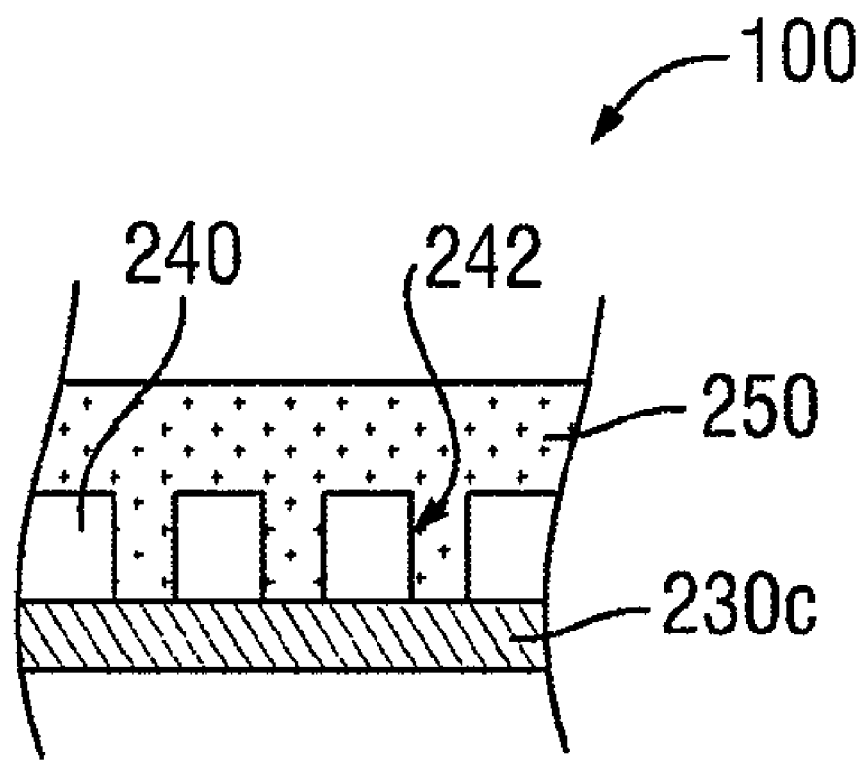

FIG. 2C is a cross-sectional view showing an embodiment of the first insulating layer 240, the second insulating layer 250 and the wirings 230c in the vicinity of the grooves 242. In this embodiment, as shown, the grooves 242 expose the wirings 230c under the first insulating layer 240, and the exposed wirings 230c in contact with the second insulating layer 250. Thereby, the contact area between the second insulating layer 250 and the first insulating layer 240 increases, and the lower wirings 230c and the second insulating layer 250 are in contact with each other through the groove 242. This configuration further increases the adhesive force.

In additional embodiments, an inorganic passivation layer 235 is interposed between the first insulating layer 240 and the wirings 230c as illustrated in FIG. 2B. The inorganic passivation layer 235 may also be provided to protect a semiconductor layer of the thin film transistors E.

As illustrated in FIG. 2B, the at least one groove 242 in the non-emitting region B exposes the inorganic passivation layer 235 under the first insulating layer 240. Thereby, the exposed inorganic passivation layer may be in contact with the second insulating layer 250. Furthermore, the grooves 242 increase the contact area between the second insulating layer 250 and the first insulating layer 240. As discussed above, this configuration increases the adhesive force.

One embodiment of a method of fabricating the organic electroluminescence display device 100 is now described in reference to FIGS. 2A-B. Referring to FIG. 2A, a plurality of thin film transistors E, capacitors, and wirings 230c are formed on substrate 200, wherein the substrate 200 comprises the light-emitting region A and the non-emitting region B.

The method may comprise forming a buffer layer 205 on the substrate 200. The substrate may, for example, be glass. In some embodiments, the buffer layer 205 is advantageously formed in order to prevent impurities (originating from the substrate 200 during a device fabrication process) from penetrating into the display device. The buffer layer 205 may comprise one or more of a silicon nitride layer $SiN_x$, a silicon oxide layer $SiO_2$, and a silicon oxide nitride layer $SiO_xN_y$.

The display fabrication method further comprises forming a semiconductor layer 210 on the buffer layer 205 in the emitting region A. The semiconductor layer 210 may comprise a crystalline silicon layer formed by crystallizing an amorphous silicon layer. The method also comprises forming a gate insulating layer 215 on the semiconductor layer 210. The gate insulating layer 215 is constructed with an insulating layer known in the art, such as a silicon oxide layer $SiO_2$. A gate electrode 220 of the thin film transistor E is formed on the gate insulating layer 215, and an interlayer insulating layer 225 is formed on the gate insulating layer 215.

Contact holes are formed in the interlayer insulating layer 225 and the gate insulating layer 215 to expose source and drain regions of the semiconductor layer 210. A conductive layer is stacked on the interlayer insulating layer 225 and patterned to form source and drain electrodes 230a and 230b in contact with the exposed source and drain regions, respectively, in the emitting region A. In addition, wirings such as the power supply lines 230c are formed in the non-emitting region B An insulating layer is formed over the gate electrode 220, and the first insulating layer 240 is formed on the light-emitting region A and the non-emitting region B. As noted above, the first insulating layer 240 may comprise an organic layer.

A via is formed in the first insulating layer 240 at the emitting region A to expose a portion of the drain electrode 230b. In one embodiment, the one or more grooves 242 are formed in the first insulating layer 240 in the non-emitting region B at the same time the via is formed in the emitting region A. The grooves 242 may expose wirings 230c under the first insulating layer 240.

In one embodiment, the method of fabricating the display further comprises forming an inorganic passivation layer 235 on the interlayer insulating layer 225, source and drain electrodes 230a, 230b, and wiring 230c, so as to protect the semiconductor layer 235. The first insulating layer 240 is formed over the inorganic passivation layer 235, and the one or more grooves 242 expose the inorganic passivation layer 235 under the first insulating layer 240.

Referring to FIG. 2B, a pixel electrode 245 is connected to the lower thin film transistor E through the via in the first insulating layer 240 and the inorganic passivation layer 235. The second insulating layer 250 is formed on the pixel electrode 245 and the first insulating layer 240. The second insulating layer 250 is patterned to expose the pixel electrode 245 in the emitting region A. The second insulating layer 250 may be formed from an inorganic material.

Thus, in the non-emitting region B, the inorganic second insulating layer 250 is formed between the organic first insulating layer 240 and the encapsulation member 270. As a result, the adhesive force between the first insulating layer 240 and the encapsulation member 270 is increased, overcoming a reduced force caused by the first insulating layer being formed from an organic material. In addition, the adhesive force is further increased by the second insulating layer 250 which is formed from an inorganic material.

Furthermore, the contact area between the second insulating layer 250 and the first insulating layer 240 is increased by the grooves 242, and the lower wirings 230c are in direct or indirect contact with the second insulating layer 250 through the grooves 242. This increased contact area between the first and second insulating layers, 240, 250 also increases the adhesive force between the encapsulation member 270 and the substrate 200.

In embodiments where the inorganic passivation layer 235 is formed under the first insulating layer 240, the adhesive force is still improved because the exposed inorganic protective layer 235 is in contact with the second insulating layer 250 by means of the grooves 242.

In the emitting region A, the second insulating layer 250 comprises an inorganic layer, such as a thin film, having a uniform thickness, so that the pixel defining layer (e.g., the second insulating layer 250) is also thin. As a result, a space between a donor substrate and the pixel electrode 245 is reduced during a light-emitting layer patterning process which uses laser thermal transfer, thereby improving the patterning process.

The method of fabricating the display 100 further comprises forming a light-emitting layer 255 on the exposed pixel electrode 245 in the emitting region A. Formation of the light-emitting layer 255 may be by way of a laser thermal transfer process. After the formation of the light-emitting layer 255, an opposite electrode 260 is formed on an upper portion of the emitting region A, and the substrate 200 is then encapsulated. Encapsulation of the substrate 200 may comprise forming the encapsulation member 270 on the second insulating layer 250 in the non-emitting region B and attaching the encapsulation substrate 280.

Thus, the embodiments of an organic electroluminescence display device described above overcome the problem of an insufficient adhesive force between a first insulating layer made of organic material and an encapsulation member, wherein embodiments of the display device comprise a first insulating layer and a second insulating layer formed in a non-emitting region of the display, wherein the first insulating layer comprises an organic material and the second insulating layer comprises an inorganic material.

In addition, patterning of the pixel layer via laser thermal transfer is improved wherein the inorganic second insulating layer in the emitting region is employed as a pixel defining layer, and the pixel defining layer is implemented with a thin film having a uniform thickness.

The adhesion force between a substrate and encapsulation member of the display is also increased by the formation of grooves in a first insulating layer in a non-emitting region of the substrate, wherein the grooves increase a contact area between a second insulating layer and the first insulating layer, and lower wirings or a lower inorganic passivation layer are in contact with the second insulating layer through the grooves.

The encapsulation effect of the encapsulation member is also improved by the inorganic second insulating layer. In addition, the encapsulation structure protects a light-emitting layer and an opposite electrode of the organic electroluminescence display device from external moisture and gas, thereby preventing defects due to operational deterioration or dark spots.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. An organic electroluminescent display device, comprising:
    a thin film transistor and wirings disposed on a substrate having an emitting region and non-emitting region;
    a first insulating layer disposed on the emitting region and the non-emitting region of the substrate, wherein the first insulating layer disposed on the non-emitting region has at least one groove formed therein;
    a pixel electrode configured to be driven by the thin film transistor and disposed on the substrate such that a surface of the pixel electrode farthest from the substrate is farther from the substrate than the first insulating layer;
    a second insulating layer disposed in the non-emitting region and in the emitting region, wherein the second insulating layer fills the at least one groove formed in the first insulating layer, directly contacts the first insulating layer inside the at least one groove, and is formed of an inorganic insulating material;
    a light-emitting layer disposed on the pixel electrode through an opening formed in the second insulating layer; and
    an encapsulation member disposed on the second insulating layer in the non-emitting region.

2. The organic electroluminescence display device according to claim 1, wherein the at least one groove formed in the first insulating layer of the non-emitting region is a circular hole, a polygonal hole, a slit, or a trench.

3. The organic electroluminescence display device according to claim 1, wherein the at least one groove exposes wirings under the first insulating layer, and wherein the exposed wirings contact the second insulating layer.

4. The organic electroluminescence display device according to claim 1, wherein the wirings are under the first insulating layer, and an inorganic passivation layer is interposed between the first insulating layer and the wirings.

5. The organic electroluminescence display device according to claim 4,
wherein the first insulating layer in the non-emitting region has at least one groove formed therein to expose the inorganic passivation layer, and
wherein the exposed inorganic passivation layer is in contact with the second insulating layer.

6. The organic electroluminescence display device according to claim 5, wherein the groove formed in the first insulating layer is a circular or polygonal hole, a slit, or a trench.

7. The organic electroluminescence display device according to claim 1, wherein the inorganic insulating material comprises one or more of a single silicon oxide layer, a single silicon nitride layer, and a stacked layer of a silicon oxide layer and a silicon nitride layer.

8. The organic electroluminescence display device according to claim 1, wherein the first insulating layer comprises an organic layer.

9. The organic electroluminescence display device according to claim 8, wherein the first insulating layer comprises at least one of a polyacrylates resin, an epoxy resin, a phenolic resin, a polyamides resin, a polyimides resin, a unsaturated polyesters resin, a poly(phenylenethers) resin, a poly(phenylenesulfides) resin, and a benzocyclobutene (BCB).

* * * * *

UNITED STATES PATENT AND TRADEMARK OFFICE
CERTIFICATE OF CORRECTION

| | | |
|---|---|---|
| PATENT NO. | : 7,915,821 B2 | Page 1 of 1 |
| APPLICATION NO. | : 11/247398 | |
| DATED | : March 29, 2011 | |
| INVENTOR(S) | : Tae-Wook Kang | |

It is certified that error appears in the above-identified patent and that said Letters Patent is hereby corrected as shown below:

At column 1, line 12, please delete "reference", and insert -- reference. --, therefor.

At column 2, line 16, please delete "layer", and insert -- layer. --, therefor.

At column 4, line 13, please delete "in", and insert -- are in --, therefor.

At column 4, line 65, please delete "B", and insert -- B. --, therefor.

Signed and Sealed this
Eighteenth Day of October, 2011

David J. Kappos
*Director of the United States Patent and Trademark Office*